United States Patent
Yoshida et al.

[11] Patent Number: 5,861,649
[45] Date of Patent: Jan. 19, 1999

[54] TRENCH-TYPE SEMICONDUCTOR MEMORY DEVICE

[75] Inventors: Hiroyuki Yoshida, Ryugasaki; Takayuki Niuya; Toshiyuki Nagata, both of Tsukuba; Yoichi Miyai, Toride; Yoshihiro Ogata, Ibaraki, all of Japan

[73] Assignee: Texas Instruments Incorporated, Dallas, Tex.

[21] Appl. No.: 871,530

[22] Filed: Apr. 21, 1992

[30] Foreign Application Priority Data

Apr. 26, 1991 [JP] Japan ................................. 3-125529

[51] Int. Cl.⁶ ..................... H01L 27/108; H01L 29/76
[52] U.S. Cl. ............................................. 257/301; 257/305
[58] Field of Search ..................... 357/23.6 G, 55; 257/301, 305

[56] References Cited

U.S. PATENT DOCUMENTS

| | | | |
|---|---|---|---|
| 4,922,313 | 5/1990 | Tsuchiya | 357/23.6 G |
| 4,999,689 | 3/1991 | Iguchi et al. | 357/23.6 |
| 5,041,887 | 8/1991 | Kumagai et al. | 357/23.6 G |
| 5,105,245 | 4/1992 | Riemenschneider et al. | 357/23.6 G |
| 5,216,265 | 6/1993 | Anderson et al. | 257/301 |

FOREIGN PATENT DOCUMENTS 62-30366  2/1987  Japan ................................. 357/23.6 G

*Primary Examiner*—Wael Fahmy
*Attorney, Agent, or Firm*—Richard L. Donaldson; William B. Kempler

[57] ABSTRACT

A dynamic RAM in which a groove (20) is formed on the main surface of a semiconductor substrate; a highly concentrated semiconductor layer (80) having one conductive type is formed inside the groove (20) to a depth sufficient to contain the first and second impurity diffusion areas (53) and (22), which are formed on the top of this groove and have the opposite conductive type; a capacitor $C_1$ formed inside the groove (20), while a transfer gate $Tr_1$ is formed on the highly concentrated semiconductor layer (80); and the diffusion area (53) is used to connect them.

10 Claims, 13 Drawing Sheets

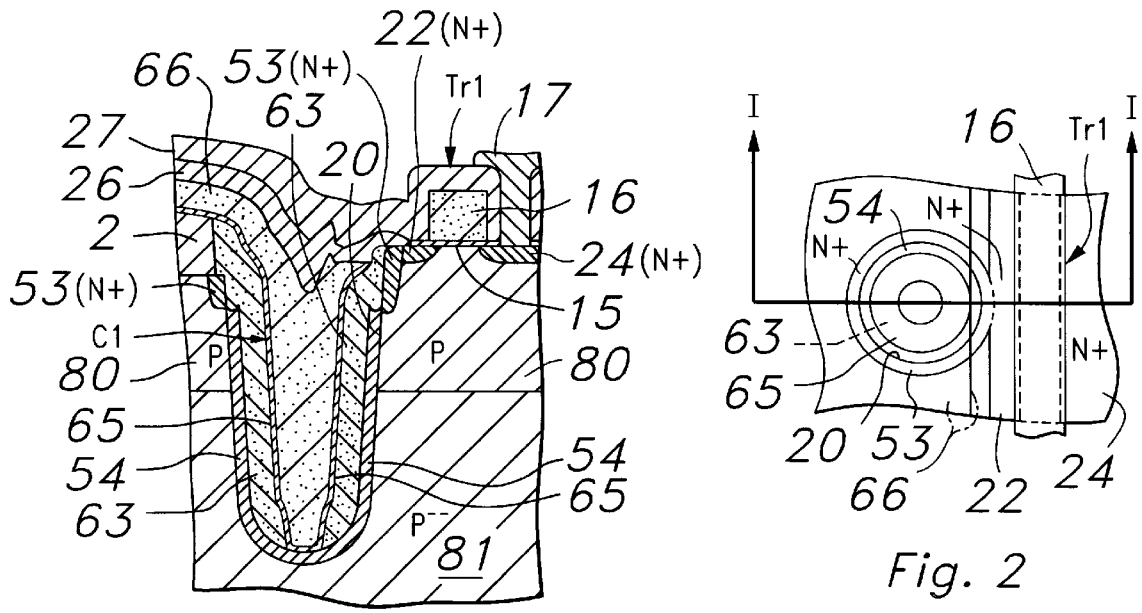
Fig. 1
Fig. 2
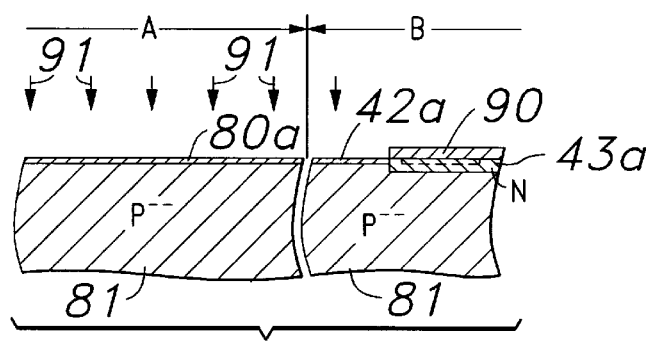
Fig. 4
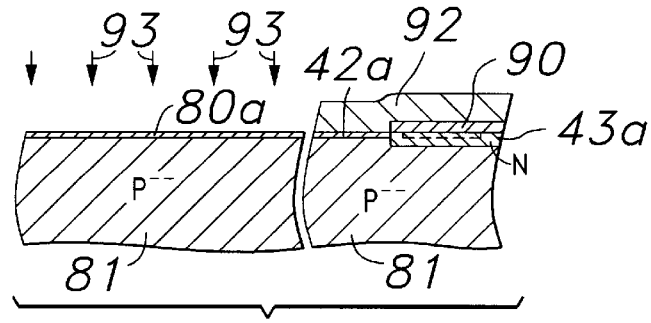
Fig. 5

Key: 1. Impurities concentration
     2. Depth
     3. Bottom of groove

TRENCH-TYPE SEMICONDUCTOR MEMORY DEVICE

The present invention pertains to a semiconductor integrated circuit device, such as a dynamic RAM (Random Access Memory), and a method for manufacturing it.

PRIOR ART

Conventionally, trench type devices having the structure shown in FIGS. 20 and 21 are used as semiconductor integrated circuit devices, such as dynamic RAMs.

Specifically, a trench-shaped groove (20) of a prescribed depth is formed on the main surface of a p$^{---}$-type silicon substrate (1) (specifically, a p$^-$-type well (40) formed on a silicon substrate). This groove (20) is covered with an insulating film (25) and then filled with an n$^+$-type polysilicon (field plate) (33).

Next, an n$^+$-type diffusion area (23), which is diffusion-formed on the entire outside surface of the groove (20), is used as an electrode in forming the capacitor C. In addition, an n$^+$-type source area (22), which is linked to the n$^+$-type diffusion area (23), and an n$^+$-type drain area (24), which is connected to a bit line (17), are diffusion-formed on the side surface (right side in FIG. 20) of the groove (20). A gate electrode (16), which serves as a word line, is situated in between these with a gate oxide film (15), thereby connecting the n-channel insulated-gate field effect transistor (transfer gate) Tr, which is used in horizontal transmission.

Two transfer gates are installed in one cell area in the memory area unit A shown in FIG. 21. The bit line (17) is installed to be common to both of these. In addition, capacitors C are connected to the transfer gates, and the electrodes (33—33) of adjoining capacitors should be connected to each other. In addition, (26) and (27) are interlayer insulating films such as (SiO$_2$ films) in the figures.

The memory cells are connected as shown in FIG. 22, in a single transistor Tr-single capacitor C construction. A capacitor is connected to ground in common between neighboring cells. Electric potential data supplied from the bit line (17) is transmitted to the capacitors when the transistors Tr are turned on. The potential transmitted to the capacitors is maintained there.

However, with the memory cells described above, since one of the capacitor electrodes (23) forms a pn junction over the entire area of the groove (20) in the space between it and the well (40) (in other words, the electrode (23) forms a pn junction), it is difficult to separate the elements of adjoining cells to provide greater integration in the device.

Specifically, as shown in FIG. 21, depletion layers (41), which extend outward from the pn junction between the n$^+$-type diffusion area (23) and the p$^-$-type well (40) in the space between neighboring capacitors C—C, make contact with each other in the area at the bottom of the groove (20) (where the concentration of impurities in the well (40) can easily drop) more quickly than other areas do, as shown by the dashed and dotted line. Thus, so-called punchthrough may occur. This punchthrough allows the charge maintained on one cell to escape to another cell, thus damaging charge preservation and hence the memory performance.

This punchthrough can easily occur when the gap between the capacitors C—C is reduced, thus making it necessary to increase the aforementioned gap as a prevention measure, which is problematic in terms of increasing the degree of integration.

Thus, it is necessary to increase the concentration of the well (40), thereby making it more difficult for the aforementioned depletion layers (41) to grow. In order to achieve this increase in concentration, when the peripheral circuitry unit B, shown in FIG. 21, is constructed as a CMOS type, it is necessary to increase the concentration of the p$^-$-type wells (40) in the cells during the formation of the p-well (42) and n-type well (43).

During this process, the wells (42) and (43) of the peripheral circuitry unit B are provided in the conventional manner with an n-channel insulated-gate field effect transistor, which consists of n$^+$ diffusion areas (44) and (45), a gate oxide film (46), and a polysilicon gate electrode (47); and a p-channel insulated-gate field effect transistor, which consists of p$^+$-type diffusion areas (48) and (49), a gate oxide film (50), and a polysilicon gate electrode (51).

The aforementioned well (40) is constructed with the same procedures (or processes) as the wells (42) and (43). However, when ion injection (or ion implantation) of impurities for the wells is performed on the corresponding surface areas, the ion injection R$_p$ for the well (40) (injection depth of maximum concentration) is set to a position considerably far below the surface. The impurities must then be diffused above and below from this area of maximum concentrated injection to form the highly concentrated well (40).

FIG. 23 shows a summary of the impurity concentration profile of the well (40) when formed in the substrate depth direction by diffusion following the aforementioned ion injection. As is shown, the concentration can be increased between the surface and a depth of several $\mu$m in general, but at deeper positions (in the figures, depth A: normally a position of several $\mu$m, corresponding to the depth of the wells (42) and (43) in the peripheral circuitry unit), the concentration of impurities can easily drop, falling considerably far below the targeted concentration near the bottom of the groove (20). Thus, it is easy for the depletion layers (41) to grow as described above, causing punchthroughs.

Thus, it is ordinarily difficult to achieve a uniformly high concentration as far as the bottom of the groove (usually at a depth of 6–8 $\mu$m). In order to achieve such a high concentration, it is necessary to properly control the aforementioned ion injection amount and depth, but such control procedures are extremely difficult.

In addition, since the surface area of the pn junction, formed by the diffusion area (23) of the capacitor in the device in FIG. 20, is large, the problem of soft errors due to alpha rays (or alpha particle) can also occur easily.

Specifically, if alpha rays (He nucleus), not shown, which are emitted from radioactive elements contained in trace amounts in the packaging material of this memory, enter the well (40) in the substrate then carriers (especially electrons) are generated in the bulk, gathering in the aforementioned capacitor (specifically, the n$^+$-type diffusion area (23)) and coupling with the charge stored there to cause discharge. As a result, the "H" level of the capacitor switches to the "L" level, which leads to malfunctions.

In addition, cells called stacked in trench types, shown in FIG. 24, have been suggested as devices for improving the alpha ray resistance and element separation discussed above.

With a stacked in trench type dynamic RAM cell, an insulating film (SiO$_2$ film) (54) is formed over the entire wall surface of the trench-shaped groove (20) except on its top. An n$^+$-type diffusion area (53) is then formed on the top (right side in FIG. 24), where the insulating film is not present, to be continuous with the source area (22) of the transfer gate Tr.

Next, the n$^+$-type diffusion area (53) is connected to a capacitor n$^+$-type polysilicon electrode (63), which is adhered on the wall surface of the insulating film (54). During this process, the diffusion area (53) is formed by the autodoping of impurities from the polysilicon electrode (63).

The capacitor C is formed with an n⁺-type polysilicon electrode (63)-SiO$_2$ film (65)-n⁺-type polysilicon electrode (66). The rest of the construction is the same as in FIG. 20.

With this type of cell, the insulating film (54) makes it possible to prevent charge leaking between the cells, thus making it possible to separate the elements to a certain extent. In addition, since the diffusion area (53) is formed only on the top of the groove (20), the surface area of the pn junction between it and the p-type well (40) is greatly reduced. Thus, even if alpha rays enter and carriers are generated in the bulk, the amount gathered in the diffusion area (53) is reduced, thus making it difficult for soft errors to occur.

However, studies of this cell have shown that the connection between the capacitor electrode (63) and transfer gate Tr source area (22) is particularly difficult to achieve, thus making it easy for element separation to be adversely affected. This situation is illustrated in FIGS. 25–26.

FIG. 25 shows a case in which a dry etching technology is used to form the trench-shaped groove (20) on the p⁻-type well (40) using the nitride film (68) on the SiO$_2$ films (2) and (67) as a mask, then adhering a photoresist (69) to the entire surface, after which it is treated with an etching back technology to selectively leave only the part of the photoresist (69) which is inside the groove (20), after which the photoresist (69) and nitride film (68) are used as masks in selectively removing the insulating film (54a) at the top of the groove (20) as shown by the dashed and dotted line.

However, in removing the insulating film (54), it is necessary to remove only the area on the side of the source area (22), as shown in FIG. 24. However, since control over the insulating film etching procedure in the depth direction of the groove (20) is poor, the insulating film (54b), which is in the peripheral areas and not at the top of the groove (20), may also be removed as shown by the dashed and dotted line.

Next, as shown by FIG. 26 in the following procedure, when the n⁺ polysilicon (63) is adhered, n-type impurities are autodoped from the polysilicon layer (63) into the silicon layer (well) (40), which is exposed to the aforementioned removal area. Thus, in addition to the n⁺-type diffusion area (53), which is essentially necessary, an n⁺-type diffusion area (70) is also formed in other areas.

Since this diffusion area (70) is formed around the groove (20) to be continuous with the diffusion area (53), depletion layers extending from the pn junction of the diffusion area (70) and well (40) may contact each other between adjoining capacitors, especially when the gap between the capacitors of adjoining cells is reduced as shown in FIG. 21.

Thus, the stored charge in one capacitor (i.e., the diffusion area (70); in other words, the polysilicon electrode (63)) may be emitted through the depletion layers to a different capacitor, thus making it impossible to separate the elements, as described above. Thus, it is necessary to control the etching procedure on the insulating film (54) shown in FIG. 25 with a high degree of precision (so that a removal area (54b) is not formed).

Thus, in order to avoid the formation of undesired areas such as the diffusion area (70), in the procedure shown in FIG. 25, after the photoresist (69) is adhered to the entire surface, only the source area side, as shown by the imaginary line 22 in FIG. 27, is selectively exposed to exposure light (71), and the exposed area is developed, then removed by etching. Next, the remaining photoresist (69) is used as a mask in locally removing by etching the insulating film as shown by the dashed and dotted line (54a).

Thus, the n-type impurities are autodoped from the polysilicon layer (63) in the procedure in FIG. 26, thus making it possible to form an n⁺-type diffusion area, shown by the imaginary line (53), only from the removal area (54a) of the insulating film (54).

However, as shown in FIG. 27, during the selective removal of the photoresist (69) by light exposure treatment, the intensity of the light exposure is not constant in the depth direction of the groove (20). Thus, light exposure control is poor. Specifically, since the photoresist (69) is usually applied by a coating technology, the coating features (and hence adhesion to the base and coating thickness) are not uniform. As a result, if the light exposure intensity is insufficient, for example, then the removal area (54a) of the insulating film (54) will be smaller than the design value, and the SiO$_2$ (67) undercut below the nitride film (68) will increase.

As a result, the n⁺-type area (53), which is formed by adhering the polysilicon layer (63) and allowing autodoping as shown in FIG. 26, is small. In addition, the polysilicon which has entered the aforementioned undercut area will remain without being removed in the following etching procedure (etching to form the shape shown in FIG. 24).

In addition, an oxide film, shown as (26a) in FIG. 28, will grow on the surface of this remaining polysilicon layer. Since this oxide film (26a) is relatively thick, it is difficult to inject the injection ions (72) during the formation of the source area (22). Thus, the obtained source area (22) is smaller than the design size, which may lead to insufficient contact with the aforementioned n⁺-type area (53). Thus, it may be impossible to satisfactorily supply the capacitor electrode (63) with a charge from the transfer gate.

OBJECT OF THE INVENTION

An object of the present invention is to offer a semiconductor integrated circuit device and its manufacturing method with which it is possible to reliably separate the elements with simple control operations, and in which there is sufficient alpha ray resistance, and the connection between the field effect transistor elements and capacitors is reliable.

SUMMARY OF THE INVENTION

Specifically, the present invention pertains to a semiconductor integrated circuit device which contains the following: an insulating film which is formed on the walls of a groove, formed on the main surface of a semiconductor substrate, in areas other than its top; a first impurity diffusion area which is formed on the aforementioned main surface surrounding the aforementioned top; a second impurity diffusion area which is formed on the aforementioned main surface to be continuous with the first impurity diffusion area; a first electrode which is formed on the wall surface of the aforementioned insulating film to be continuous with the aforementioned first impurity diffusion area; a second electrode which is formed on a dielectric film formed on the wall surface of the first electrode; and a semiconductor layer, having the conductive type opposite that of the aforementioned first and second impurity diffusion areas, which contains at least the aforementioned first and second impurity diffusion areas and is formed to the depth of the middle depth position of the aforementioned groove, and which has a higher concentration than the area below its depth position; wherein a field effect transistor element, in which the aforementioned second impurity diffusion area is a structural component, is situated on the aforementioned main surface, and a capacitor is formed by the aforementioned first electrode, the aforementioned dielectric film, and the aforementioned second electrode.

In addition, the present invention pertains to a manufacturing method for a semiconductor integrated circuit which contains the following: a procedure in which a highly concentrated insulating film is formed on the main surface of a semiconductor substrate; a procedure in which a groove, having a depth greater than the highly concentrated semiconductor layer, is formed on the aforementioned main surface; a procedure in which an insulating film is formed on the wall surface of this groove; a procedure in which this insulating film is removed from the entire top area of the aforementioned groove; a procedure in which impurities are diffused into the aforementioned highly concentrated semiconductor layer through this removed area to form a first impurity diffusion area, which has the conductive type opposite that of the aforementioned highly concentrated semiconductor layer; a procedure in which a first electrode, which is connected on top of the aforementioned groove to the first impurity diffusion area, is formed on the aforementioned insulating film; a procedure in which a dielectric film is formed on the aforementioned first electrode; a procedure in which a second electrode is formed on top of this dielectric film; and a procedure in which a second impurity diffusion area is formed on the aforementioned main surface to serve as a structural component in a field effect transistor that is continuous with the aforementioned first impurity diffusion area.

BRIEF DESCRIPTION OF THE DRAWINGS

FIG. 1 is a cross section of memory cells in a dynamic RAM of one embodiment of the present invention taken along the line I—I of FIG. 2.

FIG. 2 is a top view of the memory cells.

FIG. 4 is a cross section of the major elements involved in a step in the method for manufacturing the aforementioned RAM IC.

FIG. 5 is a cross section of the major elements involved in a step in the method for manufacturing the aforementioned RAM IC.

Figure 3:
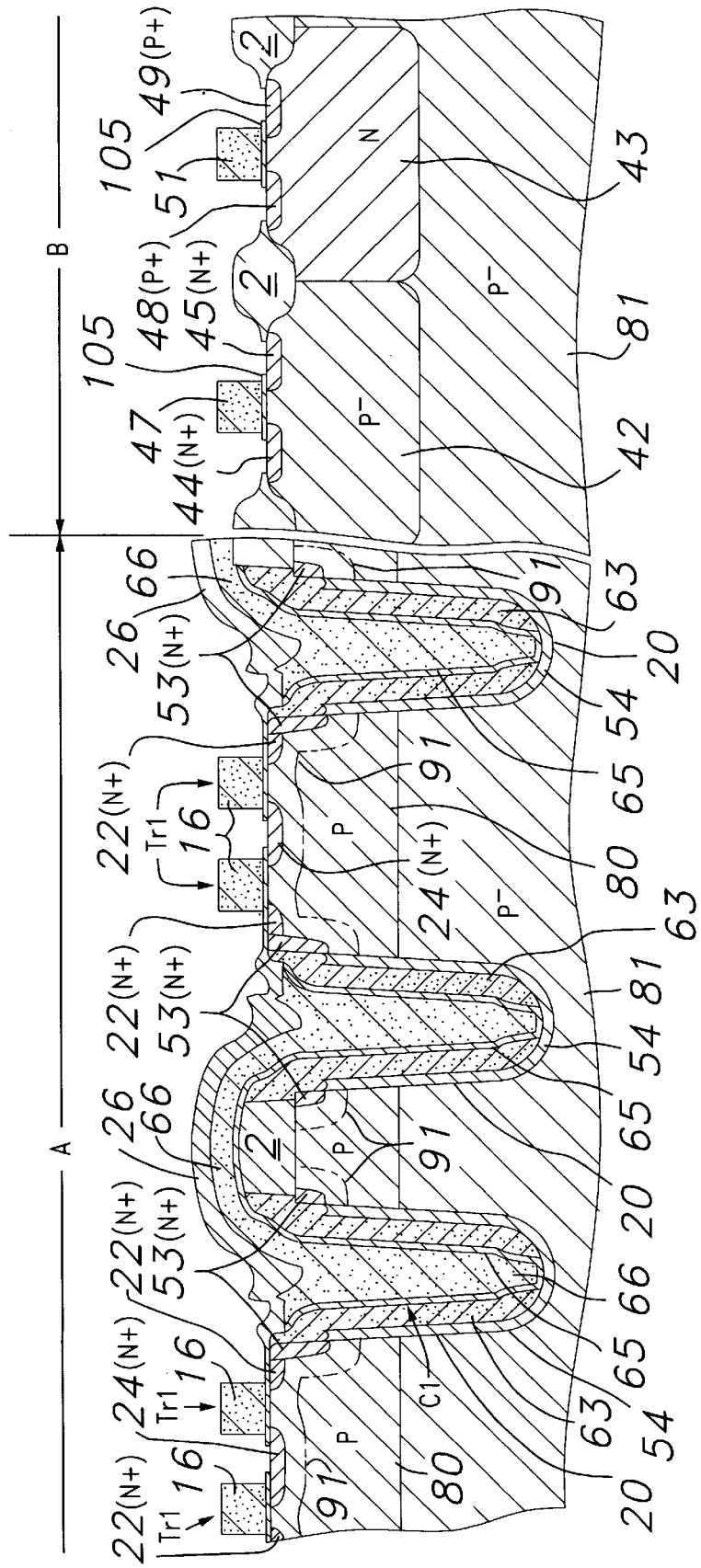
FIG. 3 is a cross section of the major parts of a RAM IC containing the aforementioned memory cells.

In reference numerals as shown in the drawings:
16. Polysilicon gate electrode
20. Trench-shaped groove
22. $n^+$-type source area
24. $n^+$-type drain area
26, 27. Interlayer insulating film
53. $n^+$-type diffusion area
54. Insulating film
63, 66. Polysilicon electrode
65. Dielectric film
80. Highly concentrated p-type well
81, 101. Substrate
91. Depletion layer
$Tr_1$. Transfer gate
$C_1$. Capacitor
A. Memory cell unit
B. Peripheral circuitry unit

DESCRIPTION OF THE PREFERRED EMBODIMENTS

FIGS. 1–3 show a dynamic RAM (such as a 64 megabit type) of the first embodiment of the present invention.

With this dynamic RAM, the memory cells consist of a single transistor-single capacitor structure, comprising a transfer gate $Tr_1$, which is composed of an n-channel insulated-gate field effect transistor; and a capacitor $C_1$, which is connected to the source areas (22) of this transfer gate. The capacitor $C_1$ is connected in common for adjoining cells.

In addition, this memory cell contains the following: an insulating film (54), which is formed on the wall surface of the trench-shaped groove (20), formed on the main side of a $p^{--}$-type semiconductor substrate (81), in all areas other than its top area; an $n^+$-type impurity diffusion area (53), which is formed into a ring shape on the aforementioned main surface around the aforementioned top area; and an $n^+$-type source area (22), which is formed on the aforementioned main surface to be connected to this impurity diffusion area (53). The transfer gate $Tr_1$ is connected to the capacitor $C_1$ by the diffusion area (53).

The capacitor $C_1$ is constructed with an $n^+$-type polysilicon electrode (63), which is formed on the wall surface of the insulating film (54) to be connected to the $n^+$-type impurity diffusion area (53); and a second $n^+$-type polysilicon electrode (66), which is formed on a dielectric film ($SiO_2$ film) (65) formed on the wall surface of the polysilicon electrode (63).

In addition, a highly concentrated $p^-$-type semiconductor layer (well) (80) is formed to the groove (20) middle depth position (such as a depth position of 2–3μm from the surface), to completely contain the $n^+$-type diffusion areas (53) and (22) (these are formed to a depth of 0.3–0.4μm, for example). This semiconductor layer (80) has a higher concentration than the area below it (i.e., a $p^{--}$-type substrate (81)), and has the conductive type opposite that of the $n^+$-type diffusion area (53).

As will be described below, the semiconductor layer (80) is absolutely necessary for controlling the growth of the depletion layers and maintaining element separation in the cells. Its concentration is set to $1 \times 10^{17}$–$3 \times 10^{17}$ atoms/cm³. The $p^{--}$-type substrate (81) has a concentration in the range of $1 \times 10^{16}$ atoms/cm³. In addition, because of the depth and concentration of the semiconductor layer (80), it can be formed with a method which enable proper control during the ion injection in the initial step of the process.

Figure 26:
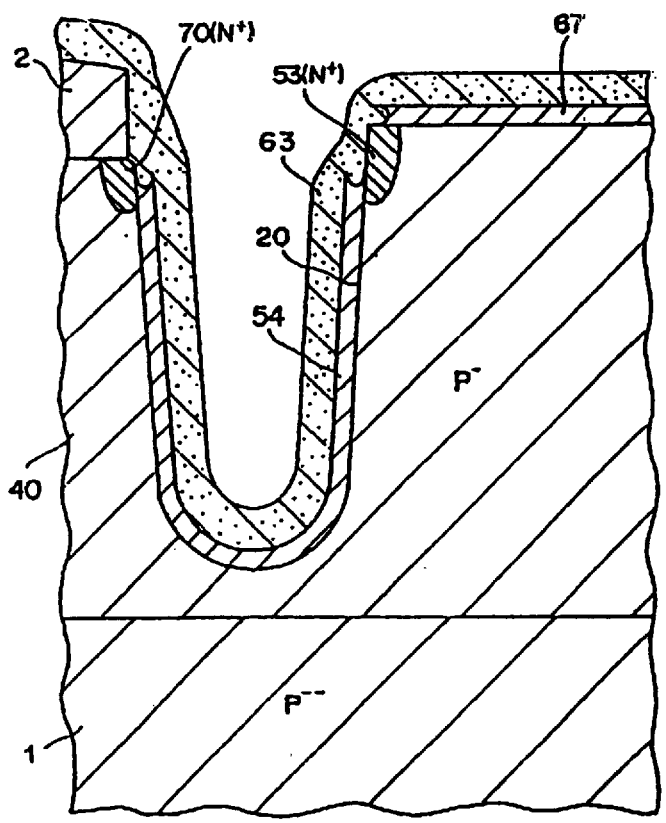
FIG. 26 is a cross section which shows a step in the method for manufacturing the aforementioned RAM IC in relation to the memory cells.

With the memory cells of the present example, the formation of aforementioned p-type semiconductor layer (80) makes it possible to control the growth of a depletion layer (91), which extends from the pn junction between it and the p-type semiconductor layer (80), even if the $n^+$-type diffusion area (53) (the area (53) on the left of FIG. 1 corresponds to the area (70) described for FIG. 26) is present over the entire top area of the insulating film (54). In addition, punchthrough due to depletion layer contact does not occur in the lower area because the insulating film (54) is present (see FIG. 3).

As a result, it is possible to prevent undesirable effects, such as the capacitors $C_1$—$C_1$ of adjoining cells being linked by the depletion layer, thereby allowing the stored charge of one [capacitor] to escape to the other. This is effectively accomplished by the combination of the aforementioned highly concentrated p-type semiconductor layer (80) and insulating film (54). Thus, it is possible to reduce the gap between the cells to the greatest extent possible, which is advantageous in increasing the integration for 64 megabit types, etc.

In addition, since the insulating film (54) is situated over a large area away from the top area of the groove (20), the surface area of the pn junction between the $n^+$-type areas (53) and (22) and the p-type semiconductor layer (80) is reduced. Thus, it is possible to prevent soft errors without the stored charge being discharged by the carriers produced through the entrance of alpha rays, as described above.

In addition, as the following manufacturing process will make clear, although the p-type semiconductor layer (80) has a high concentration, since it is only formed to a depth of several μm from the surface, it is easy to control ion injection during the initial procedure, and it is easy to control the procedures during the formation of the highly concentrated semiconductor layer (80), which is used to separate the elements.

Figure 22:
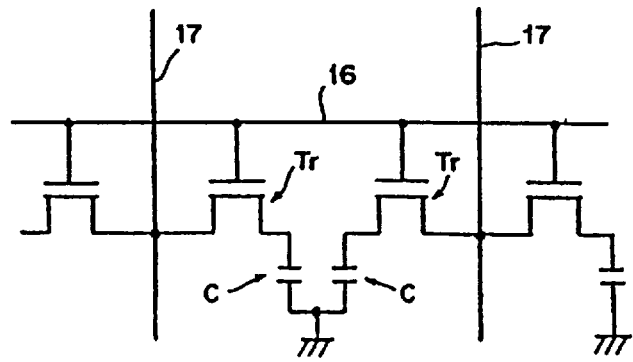
FIG. 22 is an equivalent schematic diagram of the aforementioned memory cells.
Figure 25:
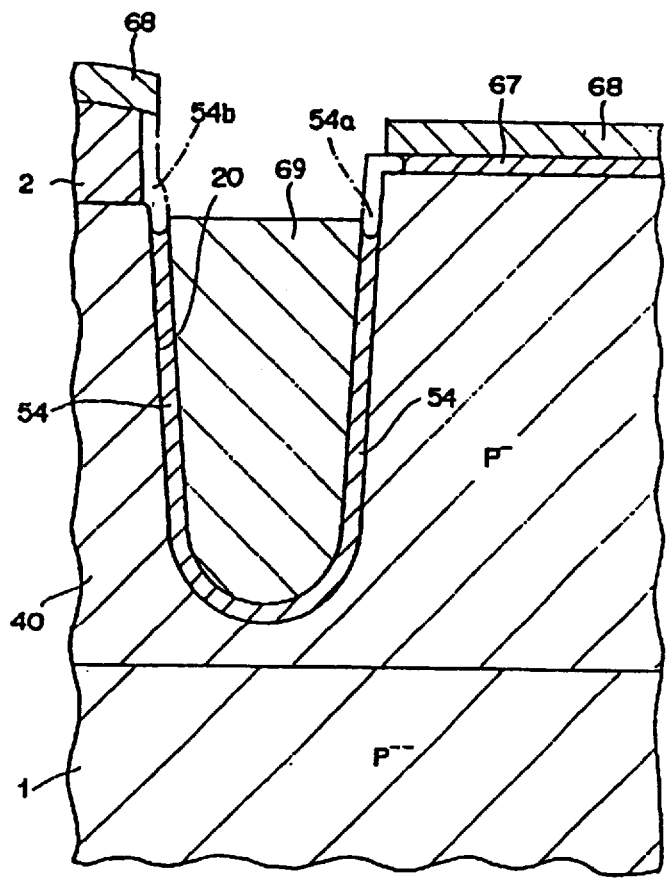
FIG. 25 is a cross section which shows a step in the method for manufacturing the aforementioned RAM IC in relation to the memory cells.
Figure 27:
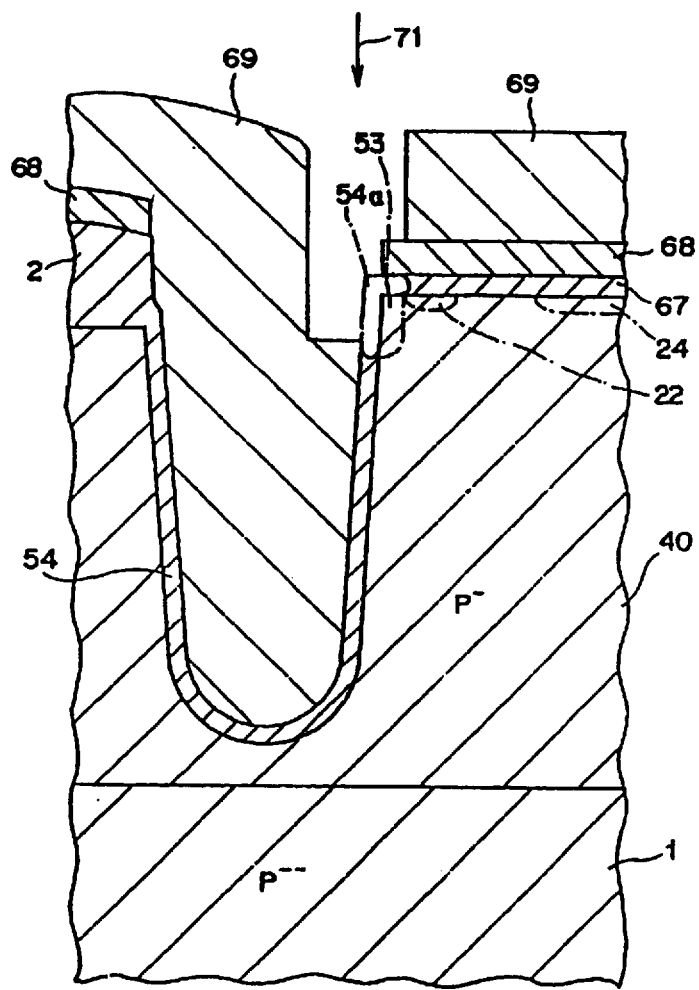
FIG. 27 is a cross section which shows a step in the method for manufacturing the aforementioned RAM IC in relation to the memory cells.
Figure 28:
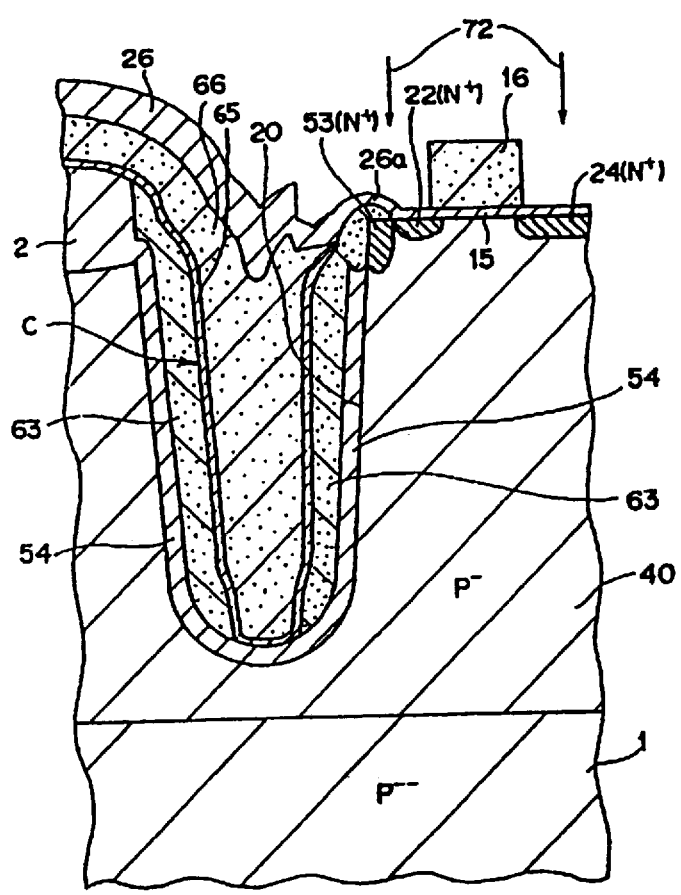
FIG. 28 is a cross section which shows a step in the method for manufacturing the aforementioned RAM IC in relation to the memory cells.

In addition, the insulating film (54) is not etched by the method described for FIG. 27; rather, the entire top area of the insulating film (54) is removed by etching using the method described for FIG. 25. Thus, the procedures are made easier, and the diffusion area (53) on the source area (22) side is formed to be sufficiently deep, thereby making it possible to achieve a reliable connection with the source area (22). In addition, the memory cells are connected in the manner illustrated in FIG. 22.

The method for manufacturing the device of the present embodiment will now be explained in relation to FIGS. 4–17.

As shown in FIG. 4, in the initial step of the process, an n-type impurity (such as As), which is used for forming the n-type well (43) in the peripheral circuitry unit B, is first ion-injected injected into the $p^{--}$-type semiconductor substrate (81), which has an impurity concentration of $1 \times 10^{16}$ atoms/cm³. Next, an oxide film (90) is locally grown. During this process, the other areas are covered with a masking material (not shown).

After an n-type impurity injection area (43a) has thus been formed, the aforementioned masking material is removed, and a p-type impurity (such as boron) (91) is injected into the entire surface using the oxide film (90) as a mask, to form p-type injection areas ((80a) in the memory cell unit A; (42a) in the peripheral circuitry unit B) in the areas where the oxide film (90) is not present.

Next, in FIG. 5, a p-type impurity (such as boron) (93) is again ion-injected with the peripheral circuitry unit B covered by a masking material as shown by (92). The p-type impurity is thus twice injected into the memory cell unit A only. As a result, the impurity concentration of the p-type impurity injection area (80a) of the memory cell unit A has a higher concentration than (42a). Thus, the dose is set to provide the aforementioned p-type well (80) with the necessary concentration of $1 \times 10^{17}$–$3 \times 10^{17}$ atoms/cm³.

Figure 6:
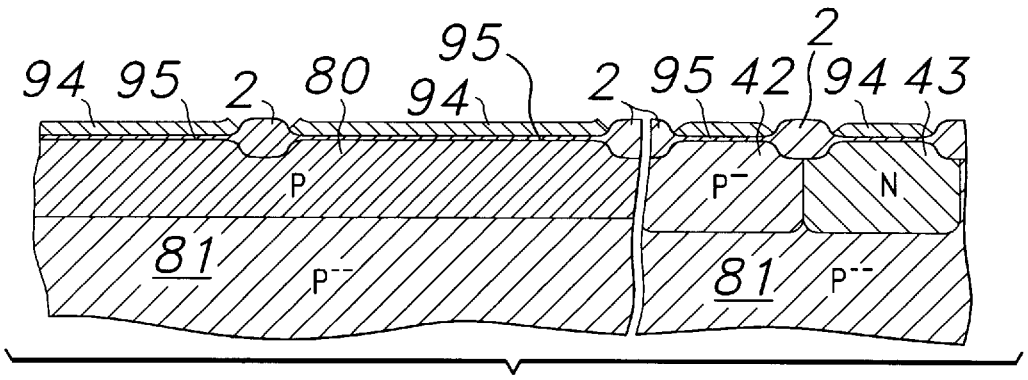
FIG. 6 is a cross section of the major elements involved in a step in the method for manufacturing the aforementioned RAM IC.

Next, as shown in FIG. 6, the aforementioned oxide film (90) is removed, after which the commonly known LOCOS (Local Oxidation of Silicon) method, in which a nitride film (94) is used as a mask, is used to selectively grow an element separating field oxide film (2) ((95) is an $SiO_2$ film in the figure). During this process, the aforementioned injected impurities are diffused in the substrate (81) to the prescribed depth, thereby forming a highly concentrated p-type well (80) in the memory cell unit to a depth of 2–3 μm, and forming a $p^-$-type well (42) and n-type well (43) in the peripheral circuitry unit, each to a depth of 2–3 μm.

Figure 7:
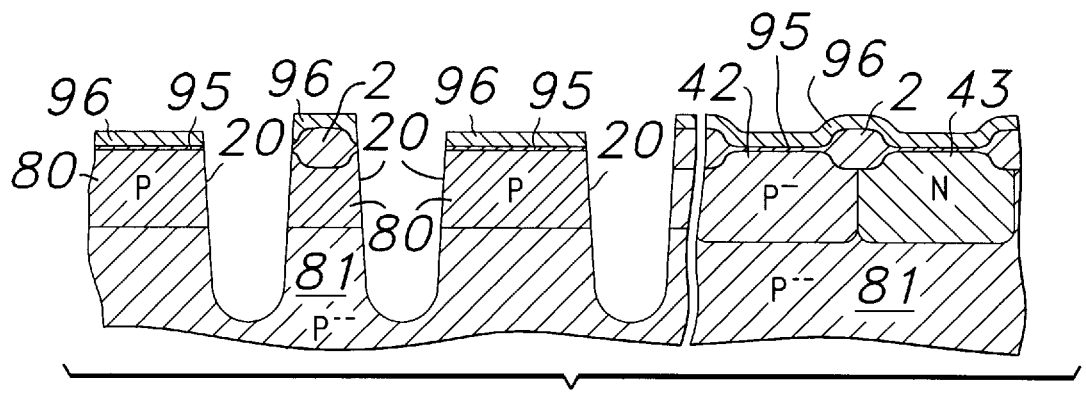
FIG. 7 is a cross section of the major elements involved in a step in the method for manufacturing the aforementioned RAM IC.

Next, as shown in FIG. 7, the nitride film (94) on the surface is once removed, and then a nitride film (96) is adhered again. The nitride film (96) is etched into the desired pattern, then it is used as a mask in etching the substrate (81). Thus, a trench-shaped groove (20), having a depth of 6–8 μm, is formed on the substrate (81) in the memory cell unit.

Figure 8:
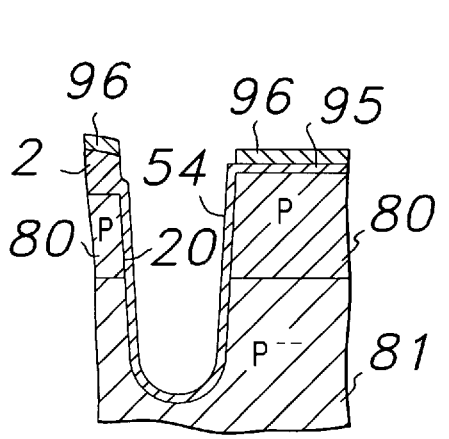
FIG. 8 is a cross section which shows a step in the method for manufacturing the aforementioned RAM IC in relation to the memory cells.

Next, as shown in FIG. 8, CVD (chemical vapor deposition method) or a thermal oxidation method is used to form an $SiO_2$ film (54), having a thickness of approximately 1000 Å, on the wall surface of the groove (20) in the memory cell unit. Only single areas are shown in the figures from FIG. 8 onward, but the other areas are treated in the same manner.

Figure 9:
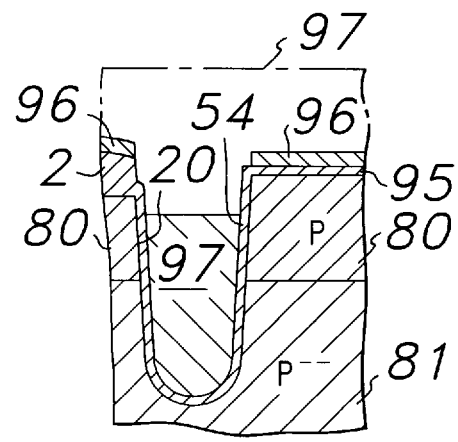
FIG. 9 is a cross section which shows a step in the method for manufacturing the aforementioned RAM IC in relation to the memory cells.

Next, as shown in FIG. 9, a photoresist (97) is coated to the level of the dashed and dotted line, then etched by an etching back technology, allowing the photoresist (97) to remain only inside the groove (20) in the area below the top of the groove.

Figure 10:
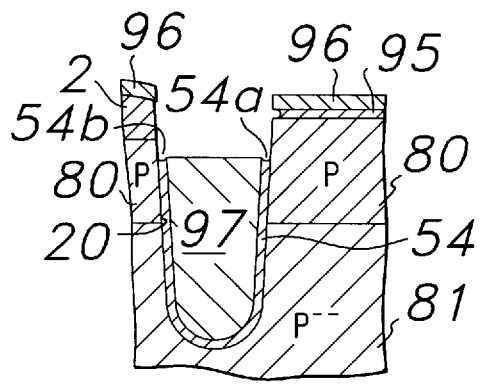
FIG. 10 is a cross section which shows a step in the method for manufacturing the aforementioned RAM IC in relation to the memory cells.

Next, as shown in FIG. 10, the photoresist (97) and nitride film (96) are used as masks in etching the $SiO_2$ film (54), thereby removing the top area of the $SiO_2$ film (54) (entire top area of the groove (20)), to form removal areas (54$a$) and (54$b$). Thus, the surface of the well (80) is exposed to these removal areas, and parts of the $SiO_2$ films (95) and (2) are also etched.

Figure 11:
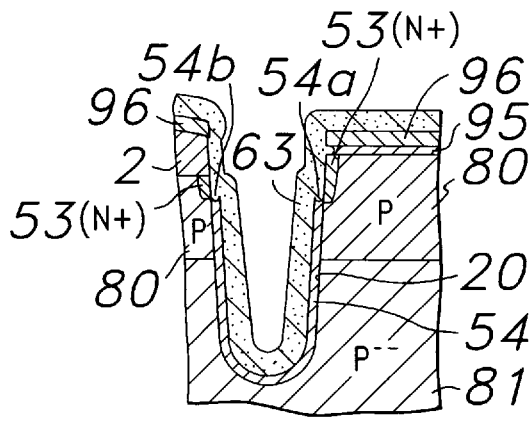
FIG. 11 is a cross section which shows a step in the method for manufacturing the aforementioned RAM IC in relation to the memory cells.

Next, as shown in FIG. 11, CVD is used to deposit an $n^+$-type polysilicon layer (63) (doped with P or As). Next, annealing is carried out to autodope the n-type impurities inside the polysilicon layer (63) into the well (80) through the aforementioned removal areas (54$a$) and (54$b$), thereby forming the $n^+$-type impurity diffusion area (53) in a ring shape in the top area of the groove (20).

Figure 12:
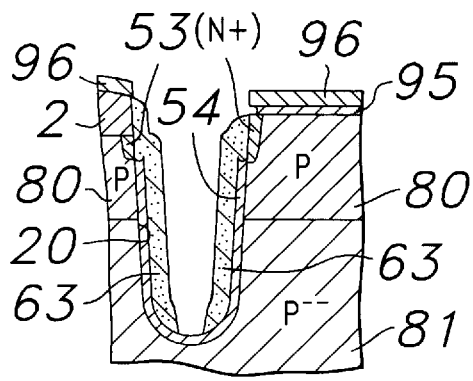
FIG. 12 is a cross section which shows a step in the method for manufacturing the aforementioned RAM IC in relation to the memory cells.

Next, as shown in FIG. 12, an anisotropic etching technology (RIE) is used to etch the polysilicon layer (63), allowing the polysilicon layer (63) to remain in a nearly cylindrical shape only on the inside walls of the groove (20) (except for the lowest area).

Figure 13:
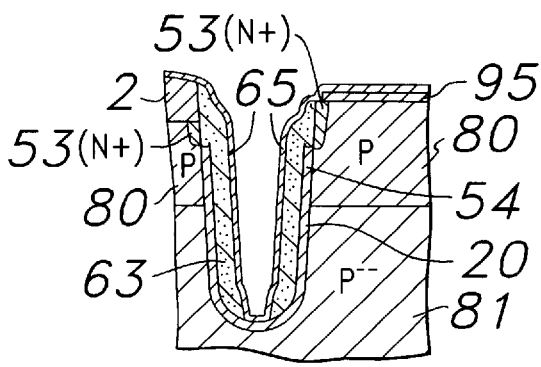
FIG. 13 is a cross section which shows a step in the method for manufacturing the aforementioned RAM IC in relation to the memory cells.

Next, as shown in FIG. 13, the nitride film (96) is removed by etching, after which CVD is used to grow an $SiO_2$ film (65) evenly over the entire surface (including the inside of the groove (20)).

Figure 14:
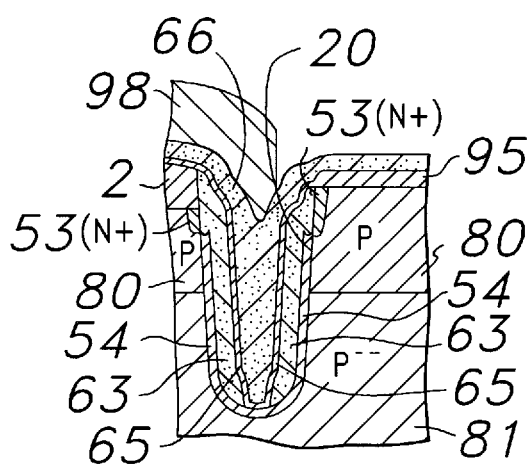
FIG. 14 is a cross section which shows a step in the method for manufacturing the aforementioned RAM IC in relation to the memory cells.

Next, as shown in FIG. 14, CVD is used to deposit an $n^+$-type polysilicon layer (66) (doped with P or As) over the entire surface. Next, a photoresist (98) is formed in the desired pattern on the groove (20).

Figure 15:
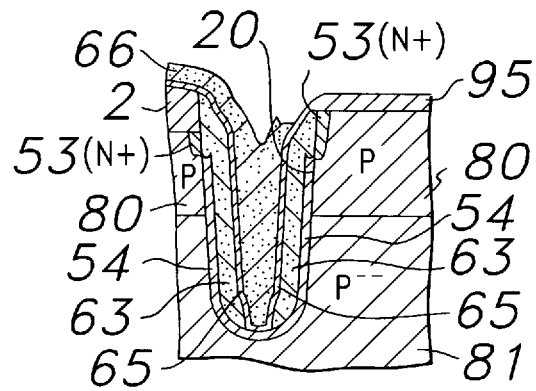
FIG. 15 is a cross section which shows a step in the method for manufacturing the aforementioned RAM IC in relation to the memory cells.

Next, the photoresist (98) is used as a mask in etching the polysilicon layer (66), allowing the polysilicon layer (66) to remain in the desired pattern as shown in FIG. 15.

Next, the $SiO_2$ film (95) on the surface is removed by etching, after which a thermal oxidation method is used to grow a relatively thick $SiO_2$ film (26) on the surface of the polysilicon layer (66), and a gate oxide film ($SiO_2$ film) (15) on the surface of the well (80). In addition, since the well (80) is highly concentrated, it is preferable during this process to first inject a small amount of an n-type impurity (such as As) into the surface of the well (80) in order to control the threshold voltage value of the transfer gate.

Figure 16:
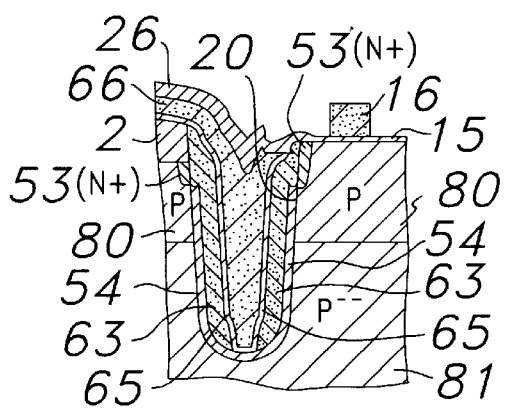
FIG. 16 is a cross section which shows a step in the method for manufacturing the aforementioned RAM IC in relation to the memory cells.

Next, a third $n^+$-type polysilicon layer (doped with P or As) is deposited by CVD in the conventional manner, then etched to form the polysilicon gate electrode (16) shown in FIG. 16.

Figure 17:
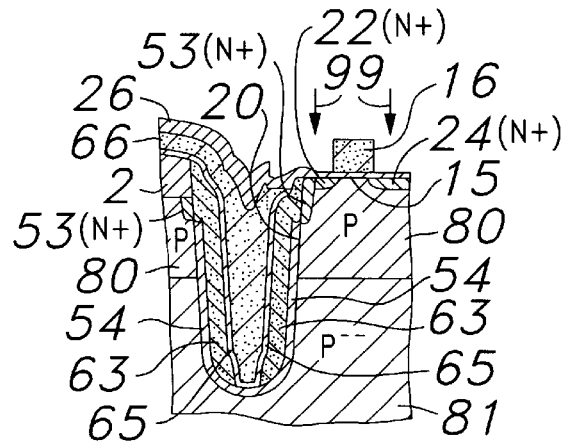
FIG. 17 is a cross section which shows a step in the method for manufacturing the aforementioned RAM IC in relation to the memory cells.

Next, as shown in FIG. 17, the peripheral circuitry unit is covered with a photoresist mask and irradiated with ions (99) of an n-type impurity (P or As), and the gate electrode (16) is used as a mask for injecting ions into the well (80) for source and drain areas, thereby forming the $n^+$-type source area (22) and a bit line (drain area) (24) to be self-aligning. During this process, the source area (22) locally overlaps the $n^+$-type area (53), thus providing a sufficient connection between them.

Next, the $SiO_2$ film (27) shown in FIG. 1 is adhered and a contact hole is formed by etching. Next, aluminum is adhered to form a bit line (17) by etching, completing the formation of the elements in the memory cell unit A.

Next, the element formation process for the peripheral circuitry unit B begins. This should be carried out in the conventional manner. Specifically, an oxide film (other than the field $SiO_2$ film (2)) and photoresist on the surface are removed from the peripheral circuitry unit shown in FIG. 7 with the memory cell unit A covered by a masking material. A thermal oxidation method is then used to form a gate oxide film (105), after which a fourth polysilicon layer is deposited evenly by CVD.

Next, the polysilicon layer is etched into the desired pattern to form polysilicon gate electrodes (47) and (51) in the wells (42). and (43).

Next, an n-type impurity (such as As) is injected with one of the wells (such as (43)) covered by a photoresist, to form self-aligning $n^+$-type diffusion areas (44) and (45). Next, the aforementioned photoresist is removed, and a $p^-$-type impurity (such as boron) is injected with the other well (such as (42)) covered with a photoresist, to form self-aligning $p^+$-type diffusion areas (48) and (49). The procedures following this will not be explained.

The memory cell unit A and peripheral circuitry unit B are thus formed to complete the dynamic RAM IC of the present invention.

Figure 21:
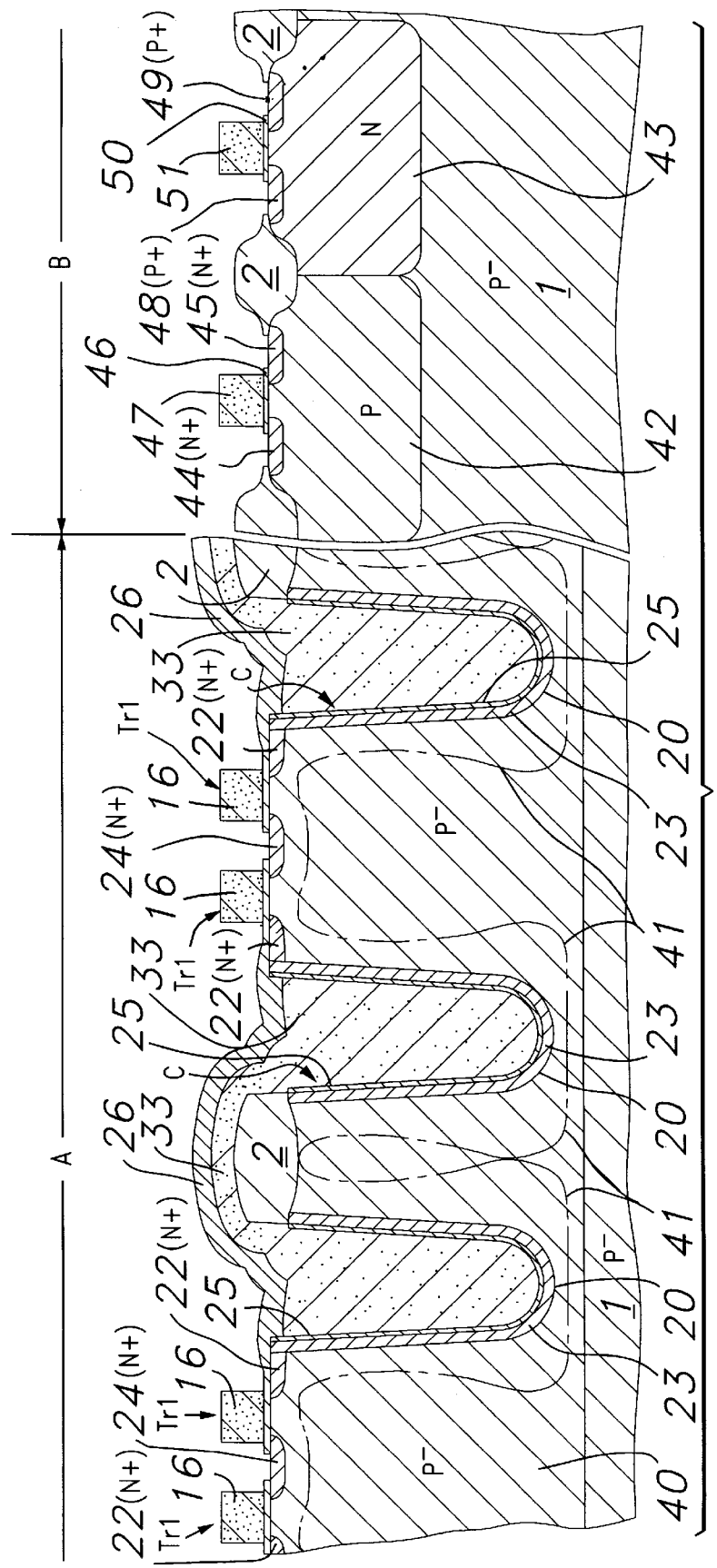
FIG. 21 is a cross section of the major parts of a RAM IC containing the aforementioned memory cells.
Figure 23:
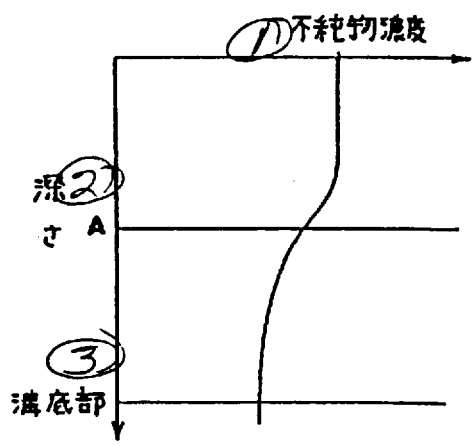
FIG. 23 is a profile of impurity concentration in the depth direction.
Figure 24:
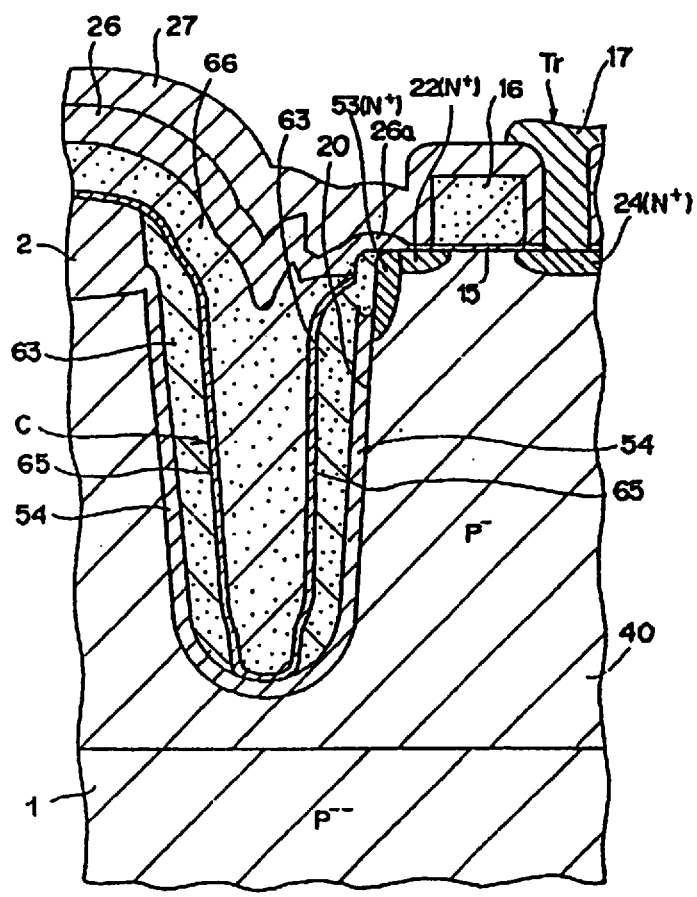
FIG. 24 is a cross section which shows a step in the method for manufacturing the aforementioned RAM IC in relation to the memory cells.

With the aforementioned manufacturing method, since the highly concentrated p-type well (80) is formed to a depth of 2–3 $\mu$m, which is approximately the same as the depth of the ordinary wells, it is possible to set the well (80) as a whole to the targeted high concentration (see FIG. 23) when the ion injection procedures shown in FIGS. 4 and 5 are carried out. In addition, there is absolutely no need to carry out the ion injection necessary for the formation of the deep well (40) shown in FIG. 21 (ion injection to a fixed depth in the bulk), and it can be achieved better diffusion control following the ion injection.

As described above, the well (80), having the ordinary depth, has the effect of suppressing the growth of the depletion layers, even if the $n^+$-type area (53) is present between the elements. In addition, the insulating effect of the insulating film (54) makes it possible to effectively prevent punchthrough between the elements.

Thus, in the aforementioned manufacturing procedure, in particular, the top area of the insulating film (54) in FIG. 10 is subjected to vigorous etching. Thus, even if removal areas (54$a$) and (54$b$) are generated in ring shapes, the $n^+$-type diffusion area (53) formed in the following procedure will have absolutely no adverse effect on element isolation because of the aforementioned reasons. Thus, it is possible to etch the insulating film (54) sufficiently, while it is unnecessary to use the mask patterning and etching shown in FIG. 27. Thus it is possible to form a sufficiently large $n^+$-type diffusion area (53) as shown in FIGS. 11, 12, and 17, and it is also possible to form the source area (22) with sufficient overlapping.

As a result, it is possible to achieve a reliable connection between the capacitor $C_1$ and transfer gate $Tr_1$.

Figure 18:
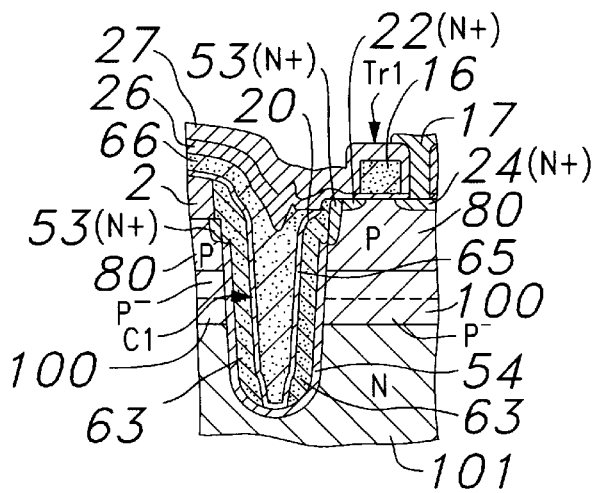
FIG. 18 is a cross section of memory cells in the dynamic RAM of the second application example of the present invention.
Figure 20:
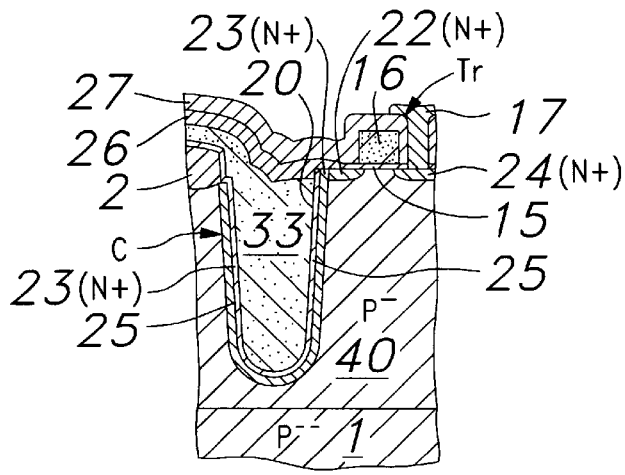
FIG. 20 is a cross section of memory cells in the dynamic RAM of a conventional example.
Figure 19:
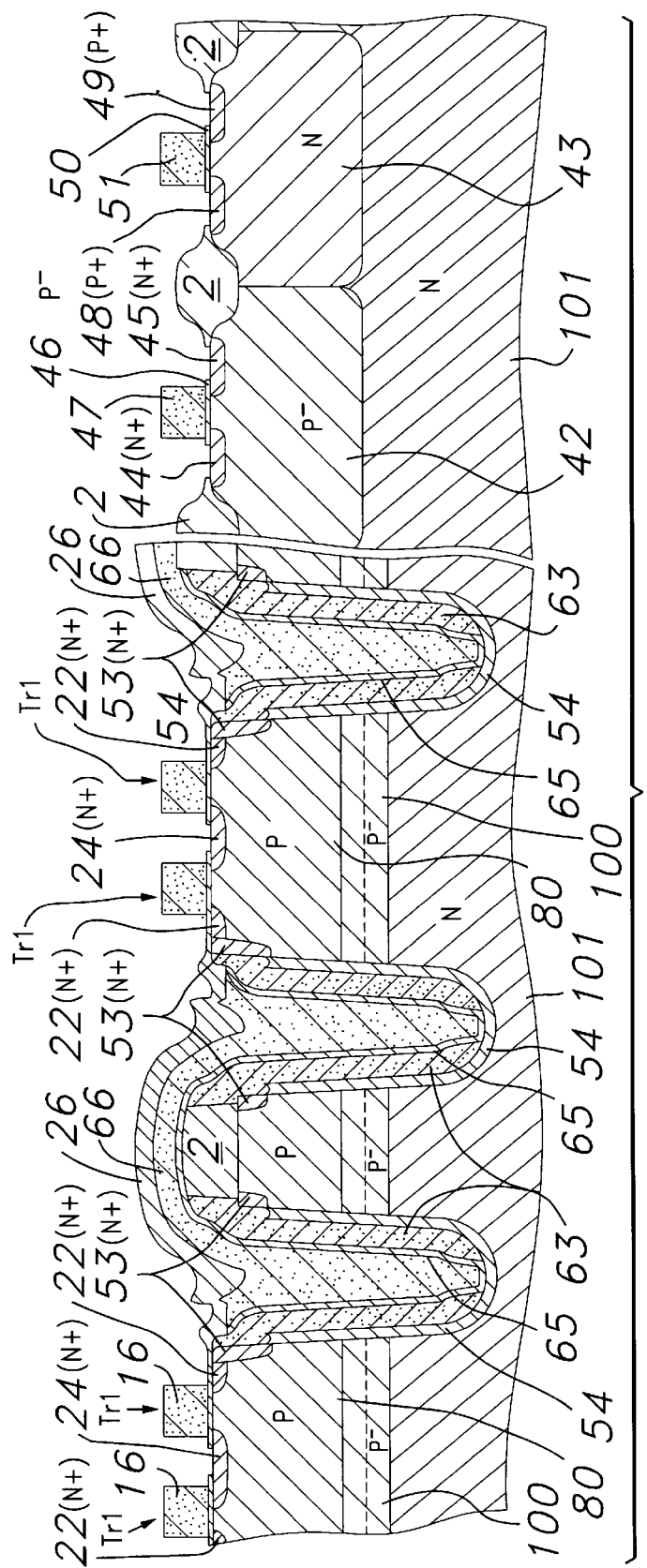
FIG. 19 is a cross section of the major parts of a RAM IC containing the aforementioned memory cells.

FIGS. 18 and 19 show a second embodiment of the present invention.

In the present embodiment, unlike the previous embodiment, an n-type substrate (101) with an impurity concentration of $1\times10^{17}$–$5\times10^{17}$ atoms/cm$^3$ is used as the semiconductor substrate. In addition, in the memory cell unit A, the highly concentrated $p^-$-type well (80) (impurity concentration of $1\times10^{17}$–$3\times10^{17}$ atoms/cm$^3$), which is used to separate the elements, is first diffused to the depth level indicated by the dashed line. In addition, a p-type semiconductor layer (100), which has a lower !concentration of impurities than the well (80), is formed between the substrate (101) and well (80J by the upward diffusion of an n-type impurity (such as As) from the n-type substrate (101). In other respects, the construction is the same as in the previous embodiment.

Thus, in the structure of the present embodiment, an n-type is used as the substrate (101), thus making it possible to supply separate well potentials to the wells (80) and (42) which form the n-channel insulated-gate field effect transistors of the memory cell unit and peripheral circuitry unit, and making it possible to improve the response speed of the transistors, especially in the peripheral circuitry unit.

Specifically, in the memory cell unit, in order to separate the elements, a back bias voltage is generally applied to the well (80). Thus, the threshold voltage of the transistors in this area rises easily. However, since it is possible to supply the well (42) in the peripheral circuitry unit with a well potential which is different from the aforementioned back bias, the threshold voltage of the transistors in the peripheral circuitry unit does, not rise but is kept at a low level, thus making it possible to maintain a high level of responsiveness.

As shown in FIG. 19, this is due to the fact that it is possible to insulate the space between the wells (80) and (42) and the substrate (101) since the substrate (101) is an n type. If the substrate were a p-type, then the wells (80) and (42) would be connected electrically, thereby forming a common potential between the wells (80) and (42). Thus, if a back bias voltage were applied to the well (80), then the same potential would be applied to the well (42), thus making it easy for the threshold value of the transistors in the peripheral circuitry unit to increase. In order to prevent this, it is necessary to control the concentration of impurities in the channel areas in the peripheral circuitry unit.

The device of the present embodiment has the same structure as the previously described device in all other respects. Thus, it is easy to achieve element separation; alpha ray resistance is good; and the connections between the areas are reliable.

The present invention has now been explained in relation to two embodiments. However, it is possible to make a variety of alterations in the aforementioned embodiments based on the technological concepts of the present invention. For example, it is also possible to form the aforementioned insulating films (54), (65), etc. with materials other than $SiO_2$, or it is possible to form a compound layer containing $SiO_2$ and another insulating film.

In addition, it is also possible to make a variety of alterations in the etching conditions and removal area size for the top area of this insulating film (54), as well as the formation methods, sizes, etc. of other areas.

The highly concentrated p-type area (well) (80) concentration controls and depth controls are not restricted to the aforementioned cases. It is possible to make a variety of selections, as long as it is at least deep enough to contain the $n^+$-type diffusion area (53), and concentrated enough to make depletion layer growth difficult. However, since the well diffusion control is poor unless it is shallower than the groove (20), the depth position must be set accordingly.

It is not always necessary to rely on well diffusion in forming this highly concentrated area (80); rather, it is also possible to use other diffusion technologies and epitaxial technology.

It is also possible to vary the formation methods and materials of the aforementioned polysilicon electrodes (63) and (66). In addition, it is also possible to change the conductive types of the aforementioned semiconductor areas to the conductive types opposite those described above (such as changing a p-type well to an n-type well). The peripheral circuitry unit is not limited to a CMOS structure.

It is of course also possible to apply the present invention to semiconductor integrated circuit elements other than highly integrated dynamic RAM which have the aforementioned structure.

As described above, with the present invention, a highly concentrated semiconductor layer is formed to be deep enough to contain at least first and second impurity diffusion areas which have the opposite conductive type. Thus, the depletion layer growing from the pn junction between these two areas is suppressed. In addition, no depletion layer is generated in the lower part of the groove since an insulating film is applied there.

As a result, it is possible to prevent undesirable occurrences such as the generation of punchthrough between adjoining elements due to depletion layer contact between the capacitors. Thus, the elements are separated reliably.

In addition, since an insulating film is applied to areas other than the top of the groove, the surface area of the pn junction between the first and second impurity diffusion areas and the highly concentrated areas is reduced, thereby making it possible to prevent soft errors without the discharge of the stored charge caused by carriers produced by the radiation of alpha rays.

In addition, since the highly concentrated semiconductor layer is formed to be shallower than the groove, it is easy to control the ion injection in the initial procedure, which is used to form the area. In addition, it is easy to control the procedures during the formation of the highly concentrated semiconductor layer which is used to separate the elements.

In addition, element separation will not be adversely affected even if the entire top area of the insulating film is removed in forming the first semiconductor area. Thus, it is easy to carry out the insulating film etching procedure, and it is easy to form a sufficiently large first semiconductor area, thus providing reliable connection with the transistor element.

The separation of adjoining elements is made reliable and alpha ray resistance is improved, thereby making it easy to control ion injection during the procedure in which the highly concentrated semiconductor layer is formed. In addition, the etching procedure for an insulating film is made easier; it is possible to form a sufficiently large semiconductor area; and the connection with the transfer elements is made reliable.

What is claimed is:

1. A semiconductor integrated circuit device comprising;
   a semiconductor substrate of a first conductivity type;
   a layer of semiconductor material of said first conductivity type but of increased dopant concentration in relation to said substrate overlying said substrate of said first conductivity type;
   said layer of semiconductor material of said first conductivity type and said semiconductor substrate of said first conductivity type being provided with a vertical trench;
   said vertical trench extending through said layer of semiconductor material of said first conductivity type and into said semiconductor substrate of said first conductivity type and bottoming within said semiconductor substrate of said first conductivity type;
   a first liner of insulation material bounding the vertical trench;
   a second liner of insulation material within the vertical trench and disposed in inwardly spaced relationship with respect to said first liner of insulation material;

first conductive material filling the portion of the vertical trench within said second liner of insulation material;

second conductive material filling the space in said vertical trench defined between said first and second liners of insulation material;

formation of a depletion layer extending toward the capacitor of the adjoining memory cell beyond an acceptable extent, wherein the depth of said layer of semiconductor material of said first conductivity type as defined by its boundary with said substrate of said first conductivity type is located at substantially the middle depth position of the vertical trench and said layer completely contains said source region and said region of the second conductivity type extending between said source region and said second conductive material to connect said field-effect transistor to said capacitor of said memory cell.

2. A semiconductor integrated circuit device as set forth in claim 1, wherein said layer of semiconductor material of said first conductivity type has a dopant concentration in the range of $1\times10^{17}$–$3\times10^{17}$ atoms/cm$^3$, and said semiconductor substrate of said first conductivity type has a dopant concentration in the range of $1\times10^{16}$ atoms/cm$^3$.

3. A semiconductor integrated circuit device as set forth in claim 1, wherein said layer of semiconductor material of said first conductivity type and said semiconductor substrate of said first conductivity type are provided with a plurality of vertical trenches disposed in spaced relationship with respect to each other;

a plurality of memory cells respectively corresponding to the plurality of vertical trenches, each of said memory cells including a capacitor and a field-effect transistor; and each of said memory cells being associated with a respective one of said plurality of vertical trenches.

4. A semiconductor integrated circuit device as set forth in claim 3, wherein the drain region of the field-effect transistor of one of said memory cells is common to the drain region of a field-effect transistor of an adjacent memory cell.

5. A semiconductor integrated circuit device comprising:

semiconductor substrate means including substrate components of at least a first conductivity type;

said semiconductor substrate means being provided with a vertical trench extending thereunto from the top surface thereof;

a first liner of insulation material bounding the vertical trench provided in said semiconductor substrate means;

a second liner of insulation material within the vertical trench provided in said semiconductor substrate means and disposed in inwardly spaced relationship with respect to said first liner of insulation material;

first conductive material filling the portion of the vertical trench within said second liner of insulation material;

second conductive material filling the space in said vertical trench defined between said first and second liners of insulation material;

said first and second conductive materials and said second insulation liner defining a trench capacitor in which said first and second conductive materials are capacitor plates and the second liner of insulation material is a dielectric layer therebetween;

a field-effect transistor provided in said semiconductor substrate means and electrically connected to said trench capacitor; and said trench capacitor and said field-effect transistor defining a memory cell;

said semiconductor substrate means comprising:

a semiconductor substrate of the second conductivity type, a buried semiconductor layer of the first conductivity type disposed on said semiconductor substrate of the second conductivity type, and a second layer of semiconductor material of the first conductivity type and of increased dopant concentration in relation to said buried semiconductor layer of the first conductivity type disposed on said buried semiconductor layer of the first conductivity type and defining the top surface of said semiconductor substrate means;

the vertical trench provided in said semiconductor substrate means extending through said second semiconductor layer of said first conductivity type and said buried semiconductor layer of said first conductivity type into said semiconductor substrate of said second conductivity type.

6. A semiconductor integrated circuit device as set forth in claim 5, wherein the field-effect transistor of said memory cell includes spaced source and drain regions of a second conductivity type disposed in said second layer of semiconductor material of the first conductivity type and opening onto the top surface thereof defining the top surface of said semiconductor substrate means;

a portion of said second layer of semiconductor material of the first conductivity type disposed between said source and drain regions of the second conductivity type defining a channel region;

a gate electrode of conductive material disposed above said channel region;

a layer of insulation material interposed between said gate electrode and said channel region and defining a gate insulator; and a region of the second conductivity type disposed in said second layer of semiconductor material of the first conductivity type and extending between said source region and said second conductive material defining a capacitor plate of said trench capacitor to connect said field-effect transistor to said capacitor of said memory cell.

7. A semiconductor integrated circuit device as set forth in claim 6, wherein said region of said second conductivity type connecting said field-effect transistor to said capacitor of said memory cell comprises an annular dopant region of said second conductivity type bounding the upper portion of the vertical trench provided in said semiconductor substrate means.

8. A semiconductor integrated circuit device as set forth in claim 5, wherein said second layer of semiconductor material of the first conductivity type has a dopant concentration in the range of $1\times10^{17}$–$3\times10^{17}$ atoms/cm$^3$, and said buried semiconductor layer of the first conductivity type has a dopant concentration in the range of $1\times10^{16}$ atoms/cm$^3$.

9. A semiconductor integrated circuit device as set forth in claim 6, wherein said semiconductor substrate means is provided with a plurality of vertical trenches extending thereinto from the top surface thereof and disposed in spaced relationship with respect to each other;

a plurality of memory cells respectively corresponding to the plurality of vertical trenches, each of said memory cells including a capacitor and a field-effect transistor; and each of said memory cells included in said semiconductor substrate means being associated with a respective one of said plurality of vertical trenches.

10. A semiconductor integrated circuit device as forth in claim 9, wherein the drain region of the field-effect transistor of one of said memory cells is common to the drain region of a field-effect transistor of an adjacent memory cell.

* * * * *